(12) United States Patent
Tran et al.

(10) Patent No.: US 7,057,258 B2
(45) Date of Patent: *Jun. 6, 2006

(54) RESISTIVE MEMORY DEVICE AND METHOD FOR MAKING THE SAME

(75) Inventors: Lung T. Tran, Saratoga, CA (US); Andrew L. Van Brocklin, Corvallis, OR (US); Warren B. Jackson, San Francisco, CA (US); Janice Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 79 days.

This patent is subject to a terminal disclaimer.

(21) Appl. No.: 10/695,710

(22) Filed: Oct. 29, 2003

(65) Prior Publication Data

US 2005/0093092 A1   May 5, 2005

(51) Int. Cl.
*H01L 29/00* (2006.01)
(52) U.S. Cl. ............... 257/530; 257/295; 257/421
(58) Field of Classification Search ............... 257/530, 257/295, 421
See application file for complete search history.

(56) References Cited

U.S. PATENT DOCUMENTS

| | | | |
|---|---|---|---|
| 5,299,151 A * | 3/1994 | Ishihara et al. ............... 365/96 |
| 5,311,039 A | 5/1994 | Kimura et al. | |
| 5,965,913 A * | 10/1999 | Yuan et al. .................. 257/321 |
| 6,005,800 A * | 12/1999 | Koch et al. .................. 365/173 |
| 6,020,777 A * | 2/2000 | Bracchitta et al. .......... 327/525 |
| 6,154,410 A | 11/2000 | Cutter et al. | |
| 6,285,055 B1 * | 9/2001 | Gosain et al. ............... 257/317 |
| 6,541,792 B1 * | 4/2003 | Tran et al. .................... 257/50 |
| 6,816,431 B1 * | 11/2004 | Lu et al. ................. 365/230.07 |
| 6,841,846 B1 * | 1/2005 | Chen et al. ................... 257/530 |
| 6,870,751 B1 * | 3/2005 | Van Brocklin et al. ....... 365/96 |
| 6,870,755 B1 * | 3/2005 | Rinerson et al. ............ 365/148 |
| 2003/0003632 A1 * | 1/2003 | Cleeves et al. .............. 438/131 |
| 2003/0132468 A1 * | 7/2003 | Raberg ........................ 257/295 |
| 2003/0179601 A1 * | 9/2003 | Seyyedy et al. ............. 365/158 |
| 2003/0218920 A1 * | 11/2003 | Harari ........................ 365/200 |
| 2003/0228710 A1 * | 12/2003 | Drewes .......................... 438/3 |
| 2004/0169254 A1 * | 9/2004 | Porter ......................... 257/530 |
| 2004/0174740 A1 * | 9/2004 | Lee et al. .................... 365/171 |
| 2005/0073023 A1 * | 4/2005 | Fifield et al. ............... 257/530 |

* cited by examiner

*Primary Examiner*—Tu-Tu Ho

(57) ABSTRACT

A resistive cross point array memory device comprising a plurality of word lines extending in a row direction, a plurality of bit lines extending in a column direction such that a plurality of cross points is formed at intersections between the word and bit lines, and at least one memory element formed in at least one of the cross points. The memory element comprises a first tunnel junction having a bottom conductor, a top conductor, a barrier layer adjacent the bottom conductor, and wherein the bottom conductor comprises a non-uniform upper surface.

12 Claims, 4 Drawing Sheets

RESISTIVE MEMORY DEVICE AND METHOD FOR MAKING THE SAME

TECHNICAL FIELD

The invention relates generally to memory devices, and, more particularly, to resistive memory elements and arrays for memory devices.

BACKGROUND

A resistive memory element is typically characterized by the capability of assuming one of two distinct resistance states at any one time. Data is stored in the element based on the resistance state of the element. Typically, a logic "1" is characterized by a high resistance, while a logic "0" is characterized by a low resistance.

A typical resistive memory element is an anti-fuse memory element. An anti-fuse memory element, as the name implies, functions in an opposite manner to a fuse. An anti-fuse element normally has a very high resistance, typically an open circuit, unless and until a program voltage is applied to the element. When a sufficient voltage is applied to an anti-fuse memory element, the element breaks down and the resistance of the element is reduced to a very low resistance, typically a short circuit. Like a blown fuse, once an anti-fuse memory element is shorted, it is typically impossible or impractical to cause it to open again. Therefore, anti-fuse memory elements are typically referred to as a write-once memory elements, or one-time programmable (OTP) memory elements.

Resistive memory elements are typically arranged in a memory array formed by a plurality of conductive traces arranged in rows and columns. The conductive traces extending along the rows of the array are generally referred to as "word lines" and the conductive traces extending along the columns of the array are generally referred to as "bit lines." The word lines and bit lines are typically oriented in an orthogonal relationship to each other. A resistive memory element is formed at each intersection (i.e., cross-point) of a word line and a bit line.

Resistive memory devices are typically formed using integrated circuit processing techniques employing various combinations of material depositions, shape definitions using photolithography, and material removal (etches), as known to persons skilled in the art. As noted above, arrays of resistive memory devices are typically formed by arranging a plurality of generally parallel word lines in a generally orthogonal relationship with a plurality of generally parallel bit lines. Each of the word lines is of a generally uniform width, as is each bit line.

The word lines are typically formed by depositing a layer of a metal conductor material, followed by a photolithography step to define the width of the lines and the distances between the conductors, followed by an etch step to remove the conductor material from the spaces between the lines. The bit lines are typically formed in the same fashion, and then are disposed orthogonally to the word lines. Since a resistive memory device, such as an anti-fuse, is formed at each intersection of a word line and a bit line, it is desirable to configure the widths of the word lines and bit lines as narrowly as possible to increase the density of resistive memory devices in an array.

The amount of voltage required to "write to," or program, a memory element depends on the thickness of the barrier layer. Therefore, in order to lower the required current or voltage, the thickness of the barrier layer must normally be reduced.

Therefore, it can be seen that it is desirable to have methods and devices for reducing the amount of voltage to program a memory element without increasing the potential of encountering shorts within the element.

SUMMARY

The present disclosure relates to resistive memory elements. In one embodiment, a resistive memory element comprises a first tunnel junction having a bottom conductor, a top conductor, a barrier layer adjacent the bottom conductor, an isolator element in series with the first tunnel junction, and wherein the bottom conductor includes a non-uniform upper surface.

The present disclosure further relates to a method producing a tunnel junction for use in a memory element. In one embodiment, the method comprises providing a bottom conductor, creating a non-uniform upper surface on the bottom conductor, depositing a barrier layer on the non-uniform upper surface, and depositing a top conductor.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

Figure 1:
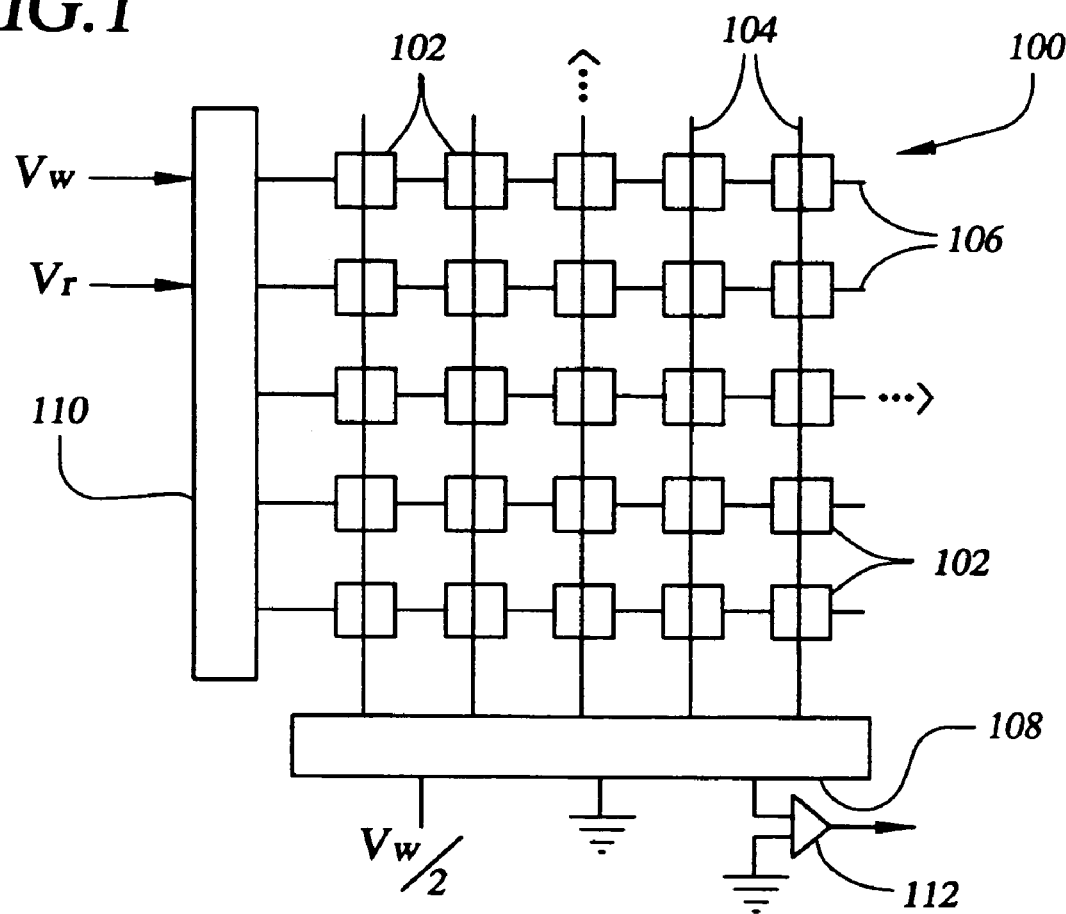
FIG. 1 is a schematic plan view of a memory device having a memory element having a non-uniform barrier layer.

Referring now to the figures, wherein like reference numerals indicate corresponding components throughout the several views, an example of a resistive memory device 100 including a memory element 102 with a non-uniform barrier layer 124 (FIGS. 4A–4D) is illustrated in FIG. 1. As shown in this figure, the memory device 100 comprises a plurality of memory elements 102 that are arranged in a two-dimensional array. A relatively small number of these memory elements 102 have been depicted in FIG. 1 for purposes of explanation. Normally, the memory device 100 comprises many more such elements 102. For instance, the device 100 may comprise a 1024×1024 array of memory elements 102.

Each memory element 102 is configured to store a single bit of information, i.e., a logic value "1" or a logic value "0.

As is further illustrated in FIG. 1, the memory device 100 also comprises a plurality of bit lines 104 and word lines 106 that are electrically coupled to the memory elements 102. Specifically, each memory element 102 is connected to a bit line 104 and a word line 106 at a cross-point of the conductors. Additionally, the memory device 100 includes column and row control circuits 108 and 110 which control switching for the various bit and word lines 104 and 106, respectively.

The row control circuit 110 includes a plurality of switches for selectively applying a programming, or write voltage Vw, to rows containing a selected memory cell 102 during write processes, or for applying a read potential Vr during read processes. Similarly, the column control circuit 108 can include a plurality of switches for coupling selected bit lines 104 containing selected memory elements 102 to ground during write processes, or for coupling selected bit lines 104 to the sense amplifier 112 during read processes.

Figure 2:
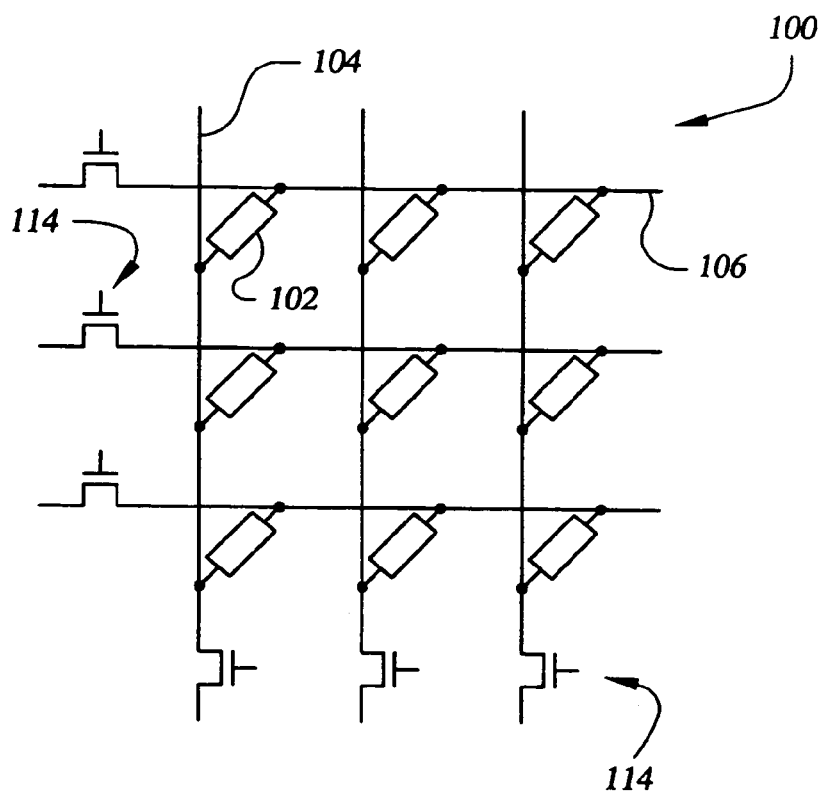
FIG. 2 is an electrical schematic representation of a switching arrangement for the memory device of FIG. 1.

Referring also to FIG. 2, the control circuits 108 and 110 include a plurality of switches, for instance transistors 114, that are used to apply voltage to or provide current flow through selected conductors. FIG. 2 illustrates a switching arrangement for a memory array device 100 of the type described above in relation to FIG. 1. As shown in FIG. 2, the memory elements 102 are represented as resistors that are electrically coupled to bit lines 104 and word lines 106. Preferred embodiments of the present memory element 102 include a tunnel junction 103 in series with an isolator element 101 (FIGS. 4A–4D). At the end of each conductor 104, 106 is a read/write transistor 114 that is used to select the various memory elements 102 during reading and writing operations.

Figure 3:
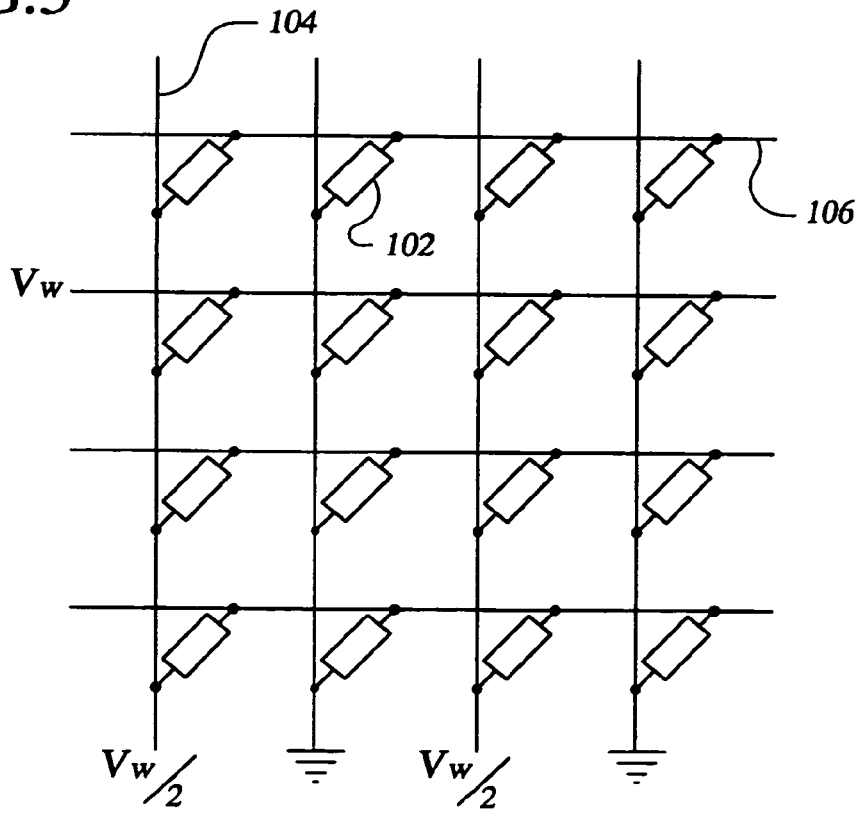
FIG. 3 is an electrical schematic representation of the memory device of FIG. 1 showing a programming operation.

Referring also to FIG. 3, in order to program, or "write to," a selected memory element 102, the row control circuit 110 closes a switch between the write voltage Vw and the word line 106 in the selected row, and the column control circuit 108 closes a switch between ground and the bit lines 104 of the selected one or more columns. The remaining bit lines 104 are connected to a voltage, such as Vw/2. As a result, the selected memory elements 102 receive the full write voltage Vw while the unselected memory elements do not. Applying sufficient write voltage Vw to the selected memory element 102 can cause an associated tunnel junction 103, i.e. fuse or anti-fuse, to break down, or "blow," and thereby change the resistance of the selected memory element 102. It is this change in the value of resistance for a selected memory element 102 that determines whether a logic value of "1" or a logic value of "0" is assigned to the memory element 102.

FIGS. 4A–4D provide detailed views of embodiments of memory elements including a barrier layer 124 having a non-uniform surface. The memory element 102 shown in FIG. 4A includes a tunnel junction 103, in the instant case an anti-fuse, which includes a thin, non-uniform barrier layer 124. The word line 106 and bit line 104, which in this embodiment function as the top and bottom conductor layers of the anti-fuse, can be made from conductive materials such as, for example, aluminum (Al), gold (Au), silver (Ag), copper (Cu), alloys thereof, and other conductors. The word line 106 and bit line 104 can be formed by processes, such as, for example, sputtering and etching processes. Note, the upper surface 123 of the word line 106 is non-uniform. The non-uniform upper surface 123 is preferably formed using an ion-etch technique. Various other techniques are discussed herein, in association with FIG. 5. In the preferred embodiment shown, the memory element 102 also includes an isolator element 101, such as, for example, a second tunnel junction, a magnetic tunnel junction, a diode, or a resistor. For example, as shown, isolator element 101 may be formed of a high resistance conductor, resulting in an isolator element in series with the anti-fuse element to control the resistance of memory elements 102 in which the anti-fuses have previously been programmed (i.e., anti-fuses that have previously been written (shorted)).

The barrier layer 124 can be formed from insulator materials, a multi-layer stack of insulator materials separated by conducting materials, a matrix of insulating material containing dispersed conductive inclusions, amorphous and crystalline semiconductor materials, phase change materials, combinations of a multi-layer stack of Si and silicide-forming metals, etc. Insulator materials include SiOX, SiNX, SiOXNY, AlOX, TaOX, TiOX, AlNX and the like; amorphous and crystalline semiconductor materials include silicon (Si), germanium (Ge), alloys of Si and Ge, InTe, SbTe, GaAs, InSe, InSb, and the like; phase change materials include alloys containing at least two elements selected from Si, Ge, arsenic (As), selenium (Se), indium (In), tin (Sn), antimony (Sb), tellurium (Te), lead (Pb), bismuth (Bi), and the like; silicide-forming metals include tungsten (W), platinum (Pt), palladium (Pd), cobalt (Co), nickel (Ni), titanium (Ti), and the like and alloys thereof. The thickness of the barrier layer 124 may be set to an arbitrary range depending on the materials used as well as the circumstances. For instance, if appreciable current flow is desired through the anti-fuse in a pre-breakdown condition, then the insulator thickness may be chosen so that significant quantum mechanical tunneling current can flow at a modest voltage.

As noted above, the anti-fuse is an element that has an initial high resistance and changes to a relatively low resistance when a critical voltage is applied. The mechanism that achieves the different resistive states is different for different materials. For example, anti-fuses formed from phase change materials have a high resistance when in an amorphous state and a low resistance when in a crystalline state. Also, anti-fuses formed from multi-layer Si and silicide-forming metals have a high resistance when the multi-layer has not been converted to silicide and a low resistance when the multi-layer has been converted to the silicide. In both cases, many orders of magnitude separate the high and low resistance states.

As another example, if an insulator type of anti-fuse is used, up to the critical voltage VC, current passes through the insulating barrier layer 124 of the metal-insulator-metal structure by eletron tunneling, and the specific resistance of the element can be rather large, for example, on the order of $10^7$ Ω-μm2. However, beyond the critical voltage VC, the barrier breaks down due to metal migration through the insulator, and the specific resistance of the element can drop to below 100 Ω-μm2. Similar current transport and breakdown mechanisms are operative in layered insulators and insulators containing conductive inclusions Preferably, once the non-uniform upper surface 123 is prepared, the barrier layer 124 is created using one of the aforementioned materials. In various embodiments of the present invention, an exemplary average thickness of the barrier layer 124 may be approximately 10–30 angstroms. As well, embodiments are envisioned wherein the opposing sides of the barrier layer 124 are separated by as little as 5 angstroms or less. These dimensions permit critical voltages, Vc, in the range of between 2 and 3 volts, for example, to cause the barrier layer 124 to break down, thereby changing the resistive state of the anti-fuse. Existing anti-fuse. elements require critical voltages of between 5 and 30 volts. The reduced range of critical voltages for embodiments of the present invention allows for reduced energy requirements when programming the memory elements.

As well, various embodiments of the present invention reduce the potential for undesired shorts occurring in the barrier layer 124 during manufacture. In an existing anti-fuse element, in order to lower the required critical voltage, the thickness of the barrier layer normally must be reduced, and this reduction can lead to undesired shorts in the barrier layer. In contrast, to utilize similar critical voltages for various embodiments of the present invention, high electric field breakdown regions formed at the tips of the non-uniform upper surface 123 of the bottom conductor allow the minimum thickness of the barrier layer 124 of the present invention to actually be thicker than the thickness of the uniform barrier layer of the existing anti-fuse, yet have approximately the same critical voltage. These high electric field breakdown regions contrast existing anti-fuse structures having planar configurations, wherein high electric field breakdown regions are not isolated to specific locations on the structure.

Figure 4A:
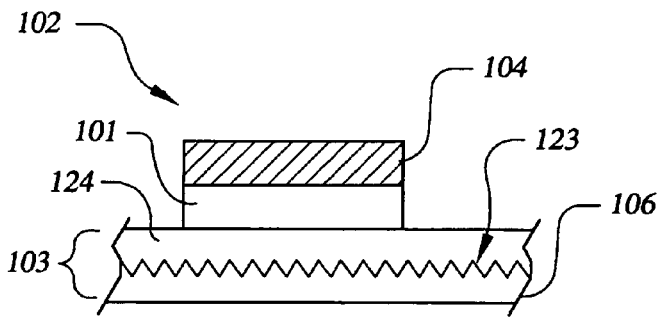
FIG. 4A is a side view of a first embodiment of memory element having a non-uniform barrier layer.
Figure 4B:
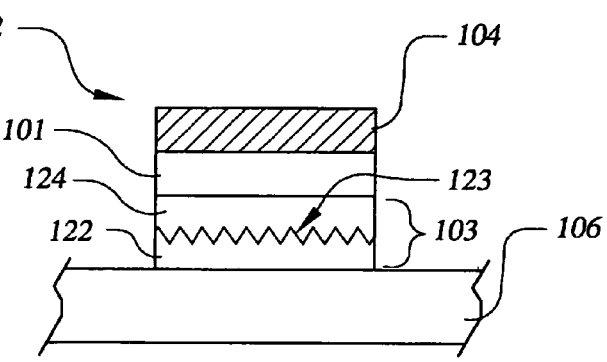
FIG. 4B is a side view of a second embodiment of a memory element having a non-uniform barrier layer.
Figure 4C:
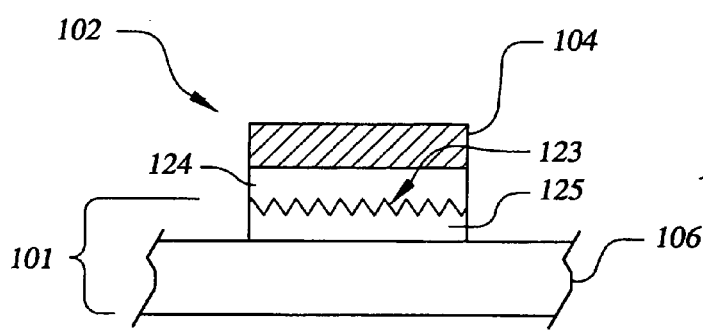
FIG. 4C is a side view of a third embodiment of a memory element having a non-uniform barrier layer.
Figure 4D:
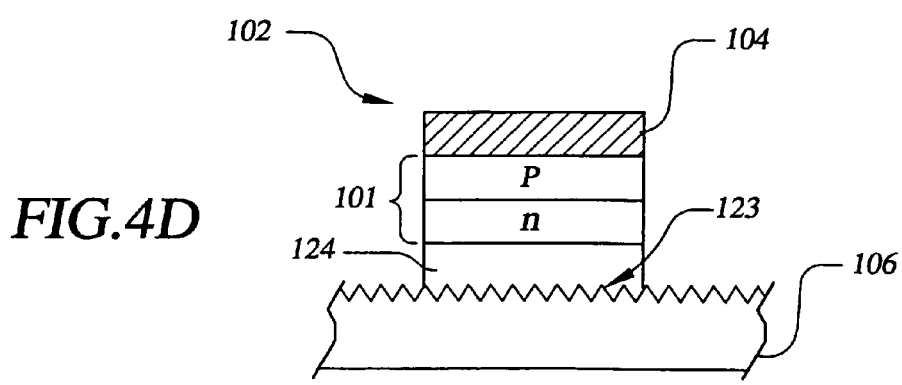
FIG. 4D is a side view of a fourth embodiment of a memory element having a non-uniform barrier layer.

FIGS. 4B–4D provide detailed views of preferred embodiments of memory elements 102 including barrier layers 124 having a non-uniform surface. FIG. 4B discloses a memory element 102 similar to that shown in FIG. 4A, with the exception that the memory element in FIG. 4B includes a bottom conductor layer 122 disposed on the word line 106 and adjacent the barrier layer 124. As such, a non-uniform upper surface 123 is created on the bottom conductor 122, rather than the word line 106. Preferably, the memory element 102 includes an isolator element 101, such as a resistor element, in series with the tunnel junction 103 (the tunnel junction including bit line 104).

FIG. 4C discloses a preferred embodiment of memory element 102 including a non-uniform barrier layer 124 and an isolator element 101. As shown, the isolator element 101 is a schottky diode formed by the word line 106 and preferably comprises platinum, and an adjacent silicon layer 125. Note, a non-uniform surface 123 is formed on the silicon layer 125 rather than a conductor layer, and the barrier layer 124 is disposed thereon.

FIG. 4D discloses a preferred embodiment of memory element 102 including an isolator element 101 in series with a tunnel junction 103. Word line 106 supports barrier layer 124 and is provided with a non-uniform upper surface 123. As shown, the isolator element 101 is a p-n diode junction.

Figure 5:
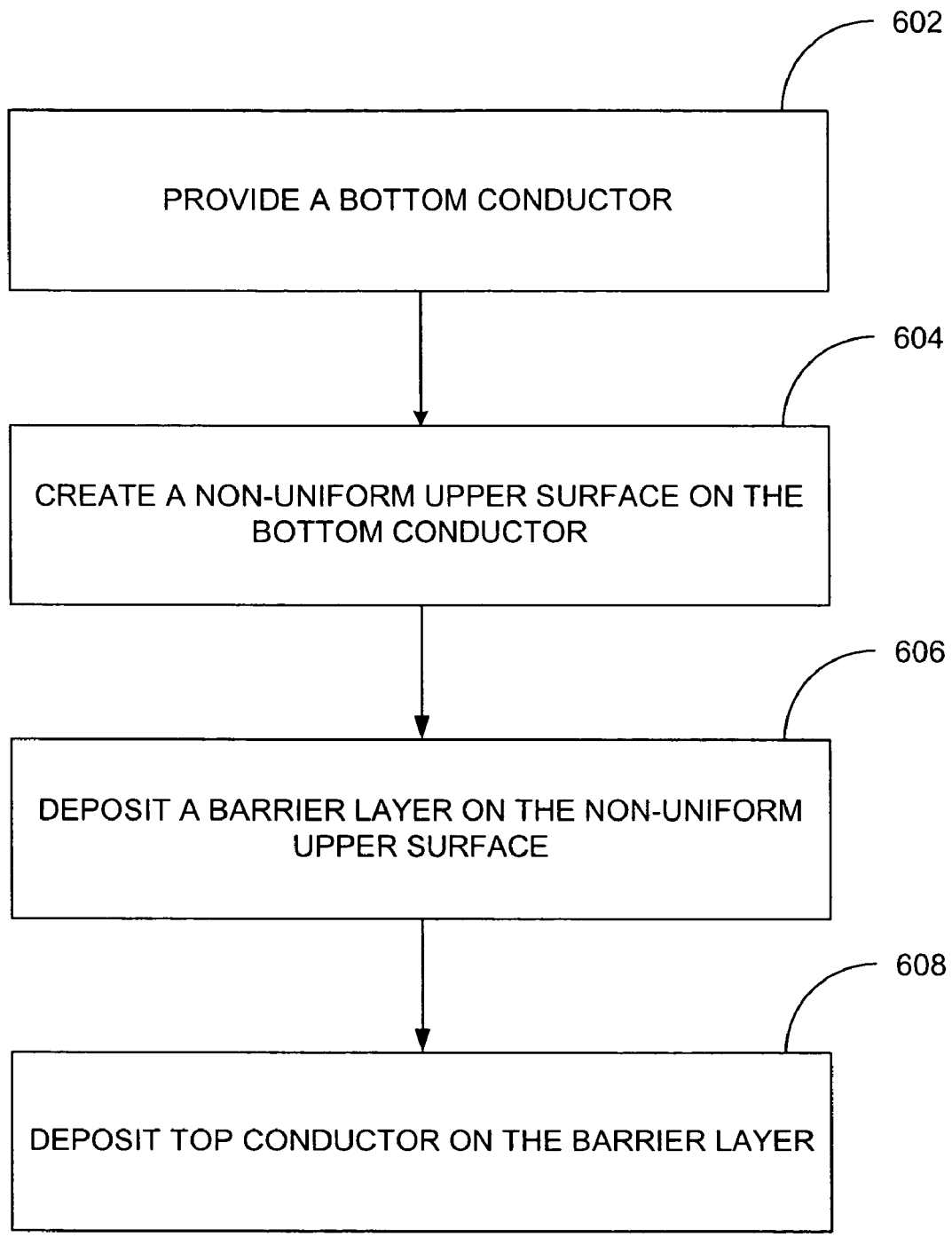
FIG. 5 is a flow diagram disclosing a method of producing a memory element having a non-uniform barrier layer.

FIG. 5 is a flow chart depicting an exemplary method of creating a tunnel junction for use in a memory element in accordance with the present invention. As shown in block 602, a bottom conductor is provided. The bottom conductor can be formed by processes, such as, for example, sputtering and etching processes. As shown in block 604, a non-uniform upper surface is created on the upper surface of the bottom conductor.

The non-uniform upper surface can be created using a variety of methods. For example, a strain-lattice mismatch can be used. If one material is grown on top of another, and the two materials have different lattice constants, strain will exist at the interface of the two materials. This interfacial strain can cause the second layer to break into grains to relieve the strain. The higher the strain, the smaller the grains. These grains tend to grow in columnar growth structure, which tends to have "domed" peaks. The domed grains create a rough surface. The larger the lattice mismatch, the smaller the grains, the steeper the dome, and the greater the surface roughness of the material.

Another method includes the material property known as "wetting." Basically, a material that "wets" well gives a uniform coverage when placed on top of a first material. A material that "wets" well will have a low surface roughness. However, a material that does not "wet" well will tend to form islands when placed on a first material. These islands grow until they coalesce, and then form grains as the material is grown thicker. A material that exhibits island growth will have a high surface roughness. The more grains a material forms the greater the surface roughness. Processing techniques may be employed to increase the number of nucleation sites for island growth. Lattice mismatch, temperature, and growth rate all contribute to the character of island growth.

Ion bombardment can also be used to roughen a surface. The effectiveness of ion bombardment can be enhanced if the material to be roughened has a texture with coherent lattice planes. The ion bombardment can be directed at such an angle so as to selectively etch some planes more than others, increasing the surface roughness. As well, chemical etchants can be used to enhance surface roughness. Some chemical etchants preferably etch a grain boundaries. Chemical etchants may be used either alone or in combination with one of the previously noted methods.

After the non-uniform surface is prepared, a barrier layer is then deposited on the bottom conductor, as shown in block 606. In a preferred embodiment, the barrier layer consists of one of the anti-fuse materials discussed hereinabove. A top conductor is deposited on the barrier layer, as shown in block 608. As with the bottom conductor, various methods may be used to form the top conductor. As previously discussed with regard to various preferred embodiments, the bottom conductor is not the only layer on which the non-uniform surface can be created (i.e., the silicon layer in FIG. 4C), and various other layers and elements can be included in the memory element.

It will be apparent to those skilled in the art that many modifications and variations may be made to the preferred embodiments of the present invention, as set forth above, without departing substantially from the principles of the present invention. All such modifications and variations are intended to be included herein within the scope of the present invention, as defined in the claims that follow.

What is claimed is:

1. A memory element comprising:

a top conductor;

a bottom conductor;

an isolator element disposed between the top conductor and the bottom conductor, the isolator element being formed of a high-resistance conductor; and a non-conductive barrier layer disposed between the isolator element and the bottom conductor, the barrier layer being in contact with the bottom conductor;

wherein the bottom conductor and the barrier layer each comprise a non-uniform surface.

2. The memory element of claim 1, wherein the memory element comprises an anti-fuse element.

3. The memory device of claim 1, wherein an average thickness of the barrier layer is between 10 and 30 angstroms.

4. The memory device of claim 1, wherein the barrier layer has a dielectric breakdown voltage of between 2 and 3 volts.

5. The memory element of claim 1, wherein the bottom conductor comprises a word line of a cross-point array of memory elements.

6. The memory element of claim 5, wherein the barrier layer extends beyond the memory element along with the word line.

7. The memory element of claim 1, wherein the bottom conductor is separate from a word line of a cross-point array of memory elements.

8. A memory element comprising:

a top conductor;

a bottom conductor;

an isolator element disposed between the top conductor and the bottom conductor, the isolator element being formed as a p-n diode junction; and a non-conductive barrier layer disposed between the isolator element and the bottom conductor, the barrier layer being in contact with the bottom conductor;

wherein the bottom conductor and the barrier layer each comprise a non-uniform surface.

9. The memory element of claim 8, wherein the memory element comprises an anti-fuse element.

10. The memory device of claim 8, wherein an average thickness of the barrier layer is between 10 and 30 angstroms.

11. The memory device of claim 8, wherein the barrier layer has a dielectric breakdown voltage of between 2 and 3 volts.

12. The memory element of claim 8, wherein the bottom conductor comprises a word line of a cross-point array of memory elements.

* * * * *